United States Patent [19]

Jech, Jr.

[11] Patent Number: 5,324,930
[45] Date of Patent: Jun. 28, 1994

[54] LENS ARRAY FOR PHOTODIODE DEVICE WITH AN APERTURE HAVING A LENS REGION AND A NON-LENS REGION

[75] Inventor: Joseph Jech, Jr., Rochester, N.Y.

[73] Assignee: Eastman Kodak Company, Rochester, N.Y.

[21] Appl. No.: 43,678

[22] Filed: Apr. 8, 1993

[51] Int. Cl.$^5$ ............................................. H01J 3/14
[52] U.S. Cl. .................................. 250/216; 250/208.1; 257/435
[58] Field of Search ............... 250/216, 226, 208.1, 250/208.3; 257/435, 432, 436; 358/212, 213.29, 213.11, 213.13, 512, 515

[56] References Cited

U.S. PATENT DOCUMENTS

| | | | |
|---|---|---|---|
| 4,684,599 | 8/1987 | DoMinh et al. | 430/270 |
| 4,694,185 | 9/1987 | Weiss | 250/578 |
| 4,966,831 | 10/1990 | Mehra et al. | 430/321 |
| 5,132,251 | 7/1992 | Kim et al. | 257/435 |
| 5,172,206 | 12/1992 | Iizuka | 257/435 |

Primary Examiner—David C. Nelms
Assistant Examiner—Que T. Le
Attorney, Agent, or Firm—Raymond L. Owens

[57] ABSTRACT

In an image sensor using photodiodes, the structure is arranged so that a lens for each photodiode focuses light onto a first portion of the photodiode. Light from the scene directly illuminates a second portion of the photodiode.

2 Claims, 2 Drawing Sheets 5,324,930

LENS ARRAY FOR PHOTODIODE DEVICE WITH AN APERTURE HAVING A LENS REGION AND A NON-LENS REGION

FIELD OF THE INVENTION

The present invention relates to lens arrays for light sensitive devices.

BACKGROUND OF THE INVENTION

Image sensing devices made up of an array of laterally spaced sensors are well known and can take a variety of forms. The array can be viewed as being made up of a number of laterally offset regions, commonly referred to as pixels or sensing elements. The art has recognized that sensing advantages can be realized by forming a lens array having a convex lens surface for each pixel. FIG. 1 shows a single pixel 10 on which a photodiode 12 can be seen through a light shield aperture 14 centrally located under a lens 16.

A lens array placed in registration with the device serves to focus the incident light upon the photodiodes. This has the effect of increasing the light gathering area of the photodiode and hence improving the signal.

The device has a lens supporting layer for offsetting the lens from the photodiode to maximize collection of light in the photodiode. The fabrication of lens arrays is based upon using conventional positive-working photoresists. A coating of the photoresist is exposed and developed to produce an array of resist islands. The resist pattern is then flood exposed to bleach the remaining photochemistry and subsequently heated until the resist material flows enough to form a lens and yet not so much as to cause adjacent lenses to flow together. Therefore, there has to be some spacing between the lenses.

The function of the photodiode is well known and produces electrons in proportion to the amount of light received on exposure. The problem with this arrangement is that light is focused onto a central region 17 of the photodiode. Since the light shield aperture and photodiode are elongated and the lens base is essentially square to match the pixel shape, the lens must be designed to focus the light through the smallest side of the light shield aperture. Therefore, only a portion of the photodiode is used to receive light. The efficiency of this type of arrangement is therefore not maximized.

SUMMARY OF THE INVENTION

It is an object of this invention to provide lens arrays with improved efficiency wherein the photodiode receives more light.

This object is achieved in an image sensor having a plurality of light sensitive devices and a lens array having the individual lenses disposed over a particular light sensitive device, the improvement comprising:

(a) a light shield provided for each device and having an elongated aperture having first and second light receiving portions; and (b) each lens being provided over the first portion of the aperture to focus light from a scene on the device so that light from the scene also directly illuminates the device through the second portion.

The following are advantages of this invention:

increased light gathering area of each pixel thereby increasing device signal; and improved utilization of the required space between adjacent lenses.

MODE OF CARRYING OUT THE INVENTION

Figure 1:
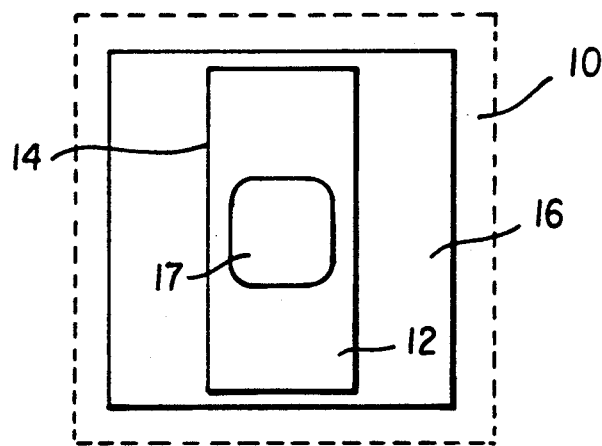
FIG. 1 is a schematic plan overhead view showing a conventional organization of aperture in light shield, photodiode, and lens over a single pixel.

Where numbers correspond to FIG. 1, the same structure is used.

Figure 2:
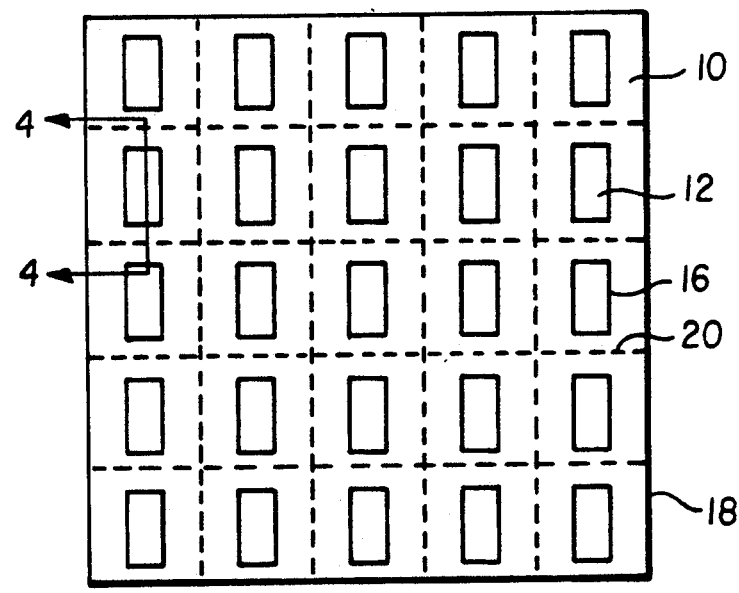
FIG. 2 is a plan view of a multipixel semiconductor array.

FIG. 2 shows a multipixel semiconductor array 18 including a plurality of laterally spaced photodiodes 12 formed in a substrate.

The substrate array is made up of a plurality of sensing elements or pixels 10. Each sensing element contains a photodiode sensor 12 centrally positioned adjacent to its upper surface and each peripherally defined by linear polygon boundaries indicated by dash lines 20.

Figure 3:
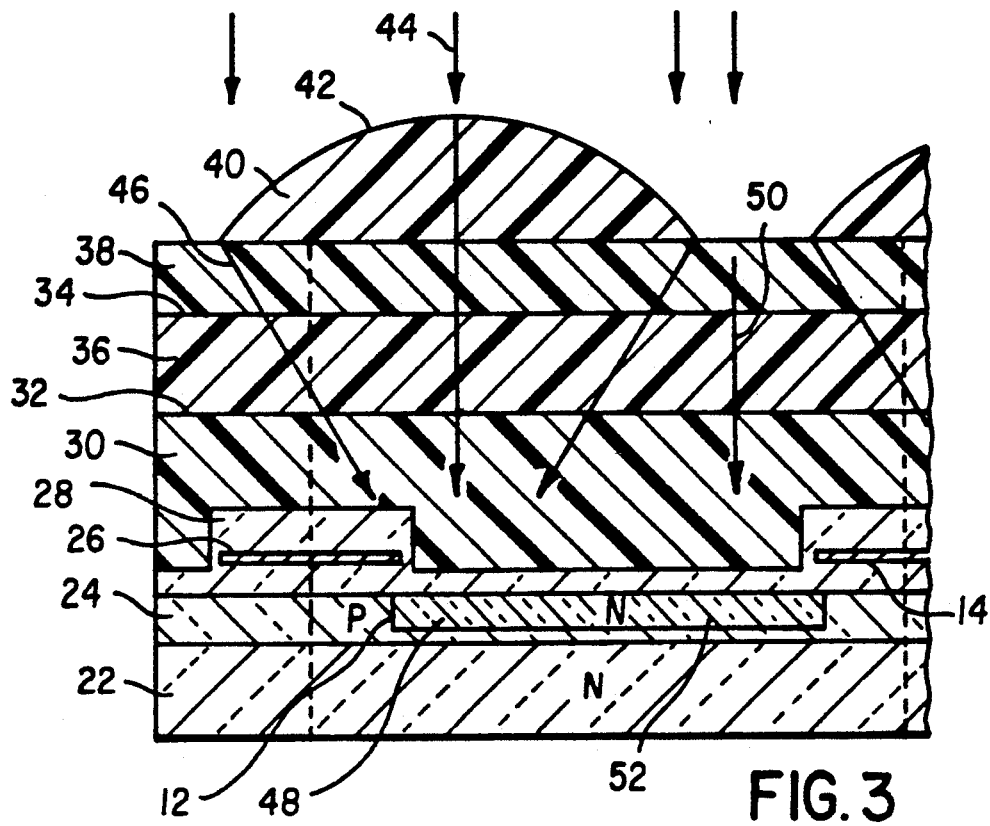
FIG. 3 is a schematic side view of FIG. 2, taken along the line 4—4, showing an arrangement according to the present invention after lens formation.

Turning now to FIG. 3 we see a schematic cross-section of a pixel 10, taken along the lines 4—4 of FIG. 2, which now includes a formed lens. In order to simplify this disclosure, only essential elements have been shown. For a more complete description of the construction of photodiode devices with lenses, see commonly assigned U.S. Pat. No. 4,966,831, the disclosure of which is incorporated by reference. A semiconductor substrate has an N conductivity region 22 and a P conductivity well 24 formed by diffusion through the surface of the substrate. The photodiode sensor 12 is formed centrally in the pixel by an N diffusion.

A light shield 26 overlays pixel regions other than the photodiode where an elongated light shield aperture 14 is patterned. This aperture is preferably rectangular in shape. A transparent insulator 28 electrically isolates the light shield 26 and also forms a protective environmental barrier over the light shield. Although presented as a unit, the insulator is typically formed in several fabrication steps. A transparent planarizing material 30 is positioned to provide a smooth surface 32. On this surface is positioned a color filter array 34 having an element 36, such as an additive primary color filter element, coextensive with the pixel or sensor element boundaries. Such color filter arrays are well known in the art. A spacer and planarization layer 38 is formed on filter 34.

A lens array 40 is formed using a photoresist in the manner described in detail in U.S. Pat. No. 4,694,185. Commonly assigned U.S. Pat. No. 4,684,599 to DoMinh et al which discloses positive-working photoresist compositions having polysulfonamides as a polymeric binder and a quinone sensitizer which provides alkali solubility to the composition when exposed to activating radiation.

The lens array 40 begins as photosensitive polymer, spin coated onto layer 38 which has been applied previously. The polymer is pattern wise exposed with light in the spectral range between 350 and 450 nm. This is followed by development in an aqueous base solution to remove the exposed areas. After development, the remaining resist receives a "flood" or non-patterning exposure designed to destroy the remaining photochemistry, thus making the pattern transparent to light over the wavelength range from 400 nm to 1000 nm. Shaping the convex lenses is accomplished by heating the patterned resist layer to a temperature below 160° C. for a time sufficient to allow the patterns to round and thus to produce lenses. The upper surface 42 of each lens is convex. For a more complete disclosure of flowing photoresist to form a lens array, see commonly assigned U.S. Pat. No. 4,694,185.

Incident light striking the pixel is indicated by arrows 44. The lens 40 is aligned to the photodiode 12 such that the light collected by the lenses, as indicated by arrows 46 is focused through the light shield and received by a first portion 48 of the photodiode 12. This lens array alignment also allows the space between adjacent lenses to be positioned over the light shield aperture allowing additional incident light from the scene, indicated by arrow 50, to be directly collected by a second portion 52 of the photodiode 12. Therefore, the light focused by the lens and the light delivered by the space between adjacent lenses is received by the photodiode.

Figure 4:
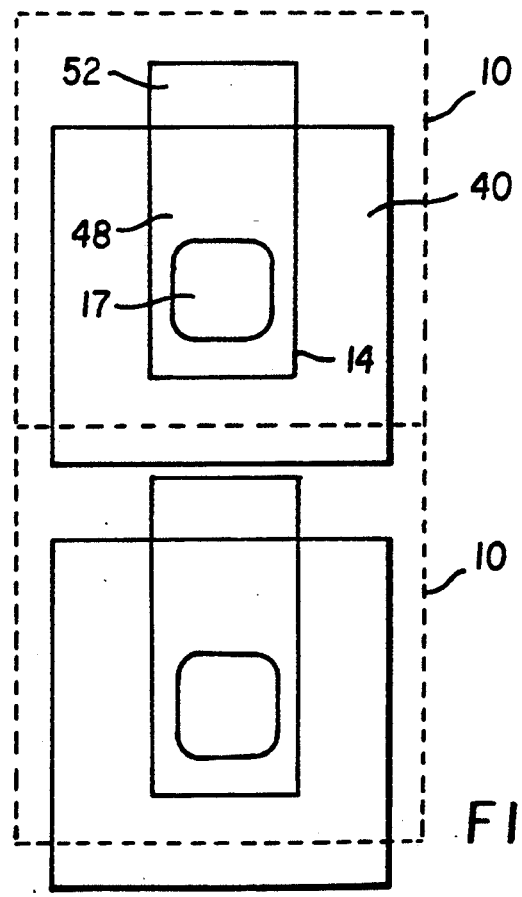
FIG. 4 is a view similar to FIG. 1, but showing a pixel organized in accordance with the present invention.

FIG. 4 shows an overhead view of two adjacent pixels 10. The lens pattern 40 has been shifted downward thereby shifting its center of focus toward the bottom side of the light shield aperture 14. The light focused by the lens strikes the larger portion 48 of the photodiode. Notice that the shift in the lens pattern enables a second portion 52 of the photodiode to receive light directly from the scene.

| Parts List | |
|---|---|
| The following is a parts list. | |
| pixel 10 | transparent insulator 28 |
| photodiode 12 | planarizing material 30 |
| aperture 14 | surface 32 |
| lens 16 | filter 34 |
| central region 17 | element 36 |
| array 18 | planarization layer 38 |
| photodiode sensor 12 | lens 40 |
| conductivity region 22 | surface 42 |
| P conductivity well 24 | portion 52 |
| light shield 26 | |

The invention has been described in detail with particular reference to certain preferred embodiments thereof, but it will be understood that variations and modifications can be effected within the spirit and scope of the invention.

I claim:

1. In an image sensor having a plurality of photodiodes and a lens array having individual lenses, each such lens being disposed over a particular photodiode, the improvement comprising:
    (a) a light shield provided for each photodiode and having an aperture; and
    (b) each lens being provided over a lens region of the aperture to focus light from a scene on a first portion of the photodiode and arranged so that light from the scene also directly illuminates a second portion of the photodiode through a non-lens region of the aperture.

2. The image sensor of claim 1 further including a color filter array positioned between the lens array and the light shield.

* * * * *